United States Patent [19]

Miyama et al.

[11] Patent Number: 4,817,706

[45] Date of Patent: Apr. 4, 1989

[54] LIQUID COOLING TYPE UNIFORM MAGNETIC FIELD COIL

[75] Inventors: Harumi Miyama; Haruo Ono, both of Chiba, Japan

[73] Assignee: Fuji Electric Co., Ltd., Kawasaki, Japan

[21] Appl. No.: 1,246

[22] Filed: Jan. 7, 1987

[30] Foreign Application Priority Data

Jan. 16, 1986 [JP] Japan .................................. 61-7072

[51] Int. Cl.$^4$ ........................ F25B 29/00; G01V 3/00; H01F 5/00; H01F 27/08
[52] U.S. Cl. ........................................ 165/30; 165/47; 324/318; 335/300; 336/57; 336/61; 336/62; 174/15.1
[58] Field of Search .................... 324/318; 165/47, 30; 336/57, 61, 62; 335/300; 310/53, 68 C; 174/15 R

[56] References Cited

U.S. PATENT DOCUMENTS

| | | | |
|---|---|---|---|
| 2,975,308 | 3/1961 | Kilbourne et al. | 310/53 |
| 3,935,488 | 1/1976 | Spirk et al. | 310/53 |
| 4,587,492 | 5/1986 | Laudermilch | 324/318 |
| 4,660,013 | 4/1987 | Laskaris et al. | 324/318 |

FOREIGN PATENT DOCUMENTS 0154013 12/1979 Japan ................................ 310/68 C Primary Examiner—Albert W. Davis, Jr.
Assistant Examiner—John K. Ford
Attorney, Agent, or Firm—Brumbaugh, Graves, Donohue & Raymond

[57] ABSTRACT

A coil designed for providing a highly uniform magnetic field suitable for use in nuclear magnetic resonance computer-aided tomography is provided with preheating apparatus which uses forced circulation of warmed liquid along the path normally circulated with the cooling liquid whereby there are simulated the normal operating coil heating conditions even when the coil is not operating so that the start-up stabilization time can be shortened.

5 Claims, 2 Drawing Sheets

LIQUID COOLING TYPE UNIFORM MAGNETIC FIELD COIL

FIELD OF THE INVENTION

The present invention relates to a magnetic field coil which uses liquid cooling and which is designed for providing a uniform magnetic field suitable for use, for example, in the image pick-up apparatus used in nuclear magnetic resonance computer-aided tomography (NMR-CT).

BACKGROUND OF THE INVENTION

The magnetic field coil for use in NMR-CT apparatus is required to generate a uniform magnetic field, having an intensity of at least 0.1 to 0.2T and a uniformity as high as 100 ppm, within a spherical magnetic field space in diameter of about 40 cm that is provided at the center of magnetic field coil, and in which a human body is set. Moreover the coil is also required to keep the variation of the intensity of the magnetic field during operation as low as 10 ppm or less, in order to prevent the disturbance of the tomographic image during the pick-up time of the image (hereinafter called the operation time), which may last as long as 10 to 20 minutes. Moreover, any expansion and compression or deformation of the coil due to a temperature change of the coil has a large influence in changing the magnetic field during the operation. Therefore it is usual to include both a cooling structure which keeps the temperature change of the coil from the original temperature set to ±0.1° C. or less, and also preheating apparatus that maintains the temperature even after the tomographic image pick-up operation ends to keep short the time for stabilizing the coil temperature when image pick-up operation is started again.

FIG. 4 schematically illustrates a prior art example of the structure of the cooling apparatus and the preheating apparatus for a uniform magnetic field coil.

In this figure, reference numeral 1 denotes a uniform magnetic field coil consisting of two pairs of Helmholtz coils 2, where a pair of liquid cooling plates 3 are respectively provided closely to both sides of a ring-shaped coil having a rectangular cross section and the coils 2 are connected in series with a DC power supply 4 for excitation. Numeral 10 denotes a cooling apparatus using a cooling liquid 100, such as water or oil, etc. comprising a flow cooling device 5 consisting of a compressor 5A, a condensor 5B, a radiator 5C and a capillary tube 5D, a heat exchanger 6 which is cooled by the flow cooling device, a circulation pump 7, a back pressure pump 8, and a liquid tank or reservoir 9 which also works as a venting tank for the cooling liquid and houses a float valve 9A and a temperature sensor 9B. Cooling apparatus 10 communicates with the cooling plates 3 of the coils 2 by way of a regulator valve 13B consisting of a pair of valves that operate in synchrony, and a cooling liquid path 13A. The cooling apparatus also cools a rectifying element of the DC power supply 4 through the cooling liquid path 14A. Moreover, numeral 24 denotes a preheating apparatus comprising a temperature sensor 24A which senses temperature at the inlet port of the cooling liquid and a control circuit 24B which receives an output signal from the temperature sensor 24A and generates a signal for controlling the output current of the DC power supply 4.

In apparatus constituted as described above, temperature control (cooling) of the uniform magnetic field coil 1 which is generating the uniform magnetic field 11 is carried out as follow: First, both of the regulator valves 13B are opened and the bypass valve 14C is closed. Then the cooling liquid which has been cooled to a predetermined temperature $T_0$, for example, to 20°±0.1° C., by starting the pumps 7, 8 and flow cooling device 5, is made to circulate into each cooling plate 3 of the coil 1 and the power supply 4. Also a predetermined excitation current $I_0$, is supplied to the coil 1 by starting the power supply 4. In this case, since the thermal resistance between the coil and cooling liquid is smaller than that between the coil and ambient air, the temperature of coil 1 is little influenced by the ambient temperature and it can be kept constant to a temperature $T_1$, for example, to 40° C., where the heat generated in the coil is equilibrated to the heat eliminated by the cooling liquid 100. In other words, a stabilized tomographic image can be obtained by limiting the temperature of cooling liquid 100, which is controlled by an output signal of the temperature sensor 9B, to a variation of 0.1° C. or less during the operation time required by the NMR-CT for a tomographic image. Next, the regulation valves 13B are closed when the tomographic image is completed, and only the power supply 4 is cooled by adjusting a bypass valve 14C. The coil 1 is then set to self-cooling operating condition and the power supply 4 is made to control the preheating operation by the preheating control apparatus 24 comprising the temperature sensor 24A and control circuit 24B. In this case, when the setting temperature of control circuit 24B is set to a temperature which is almost equal to the operating temperature $T_1$ of coil 1, the output current of the power supply 4 is reduced when the temperature of cooling plates 3 comes close to the operation temperature $T_1$, and the temperature of the coil can be stabilized and maintained at a temperature near the operation temperature under the condition that the heat generated by the coil is balanced with the heat radiated by natural cooling.

However, when coil 1 is enclosed within an air-conditioned chamber having a cover (not illustrated) for temperature control as is usual, a temperature difference in the vertical direction is generated in the ambient temperature within the cover. Accordingly, the coil in the self-cooling condition is influenced by the ambient temperature, resulting in the problem that the temperature is higher at the upper part of coil than at the lower part. As a result the coil is thermally deformed due to the generation of thermal stress within the coil. Under this condition, when the operation is restarted by closing valve 14C, opening regulation valves 13B, and applying an excitation current $I_o$ to the coil 1 by changing the preheating control operation of power supply 4 to its normal operating condition, since the cooling liquid 100 which is cooled to temperature $T_0$ by operation of the cooling device 10 even during preheating control operation, changes its flow path from the bypass valve 14C to the cooling plates of the uniform magnetic field coil 1 through regulation valves 13B the coil can be cooled immediately. Nevertheless it is found that a stabilization time (waiting time) of at least 45 minutes or more is actually required until the tomographic image is stabilized, even though it is estimated that the temperature of the coil is equilibrated to the operation temperature $T_1$ within a shorter period. Therefore shortening of the stabilization time and improvement of the working efficiency of NMR-CT are desirable.

The present invention has been developed in light of the aforementioned background and the object of the present invention is a uniform magnetic field coil comprising a novel preheating apparatus of simple structure to reduce the stabilization time.

SUMMARY OF THE INVENTION

The present invention is based on the fact that in the prior art a long stabilization time is needed because of the thermal deviation of coil and the thermal stress of the coil due to such thermal deviation. To this end, the invention provides preheating apparatus which includes a heater whose ON-OFF state is controlled by the temperature at the inlet port along the path of the cooling liquid to the cooling plates. This heater is used to heat the cooling liquid when the coil is not being excited to keep the cooling liquid at essentially the same temperature it has while the coil is being excited. Thereby, the temperature of the entire coil can be maintained at the desired operating temperature without the influence of the ambient temperature by making use of the low thermal resistance between the coil and its cooling plates whereby any vertical temperature difference in the coil, the so-called temperature deviation, can be prevented.

EMBODIMENT OF THE INVENTION

Figure 1:
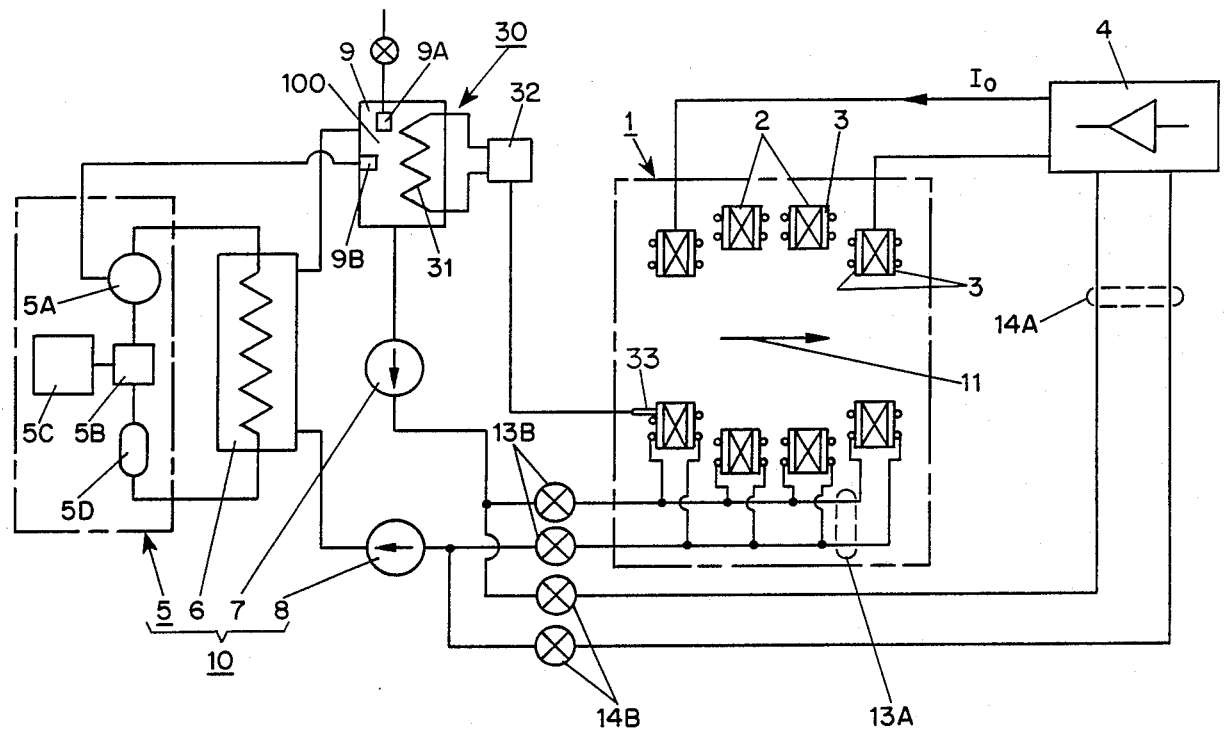
FIG. 1 schematically illustrates the structure of a preferred embodiment of the present invention.

The present invention will be described with reference to the preferred embodiment of FIG. 1. The elements corresponding to those of the prior art are given the same reference numerals and detailed explanations of these are omitted. In FIG. 1, numeral 30 designates the novel preheating apparatus. This apparatus includes a heater 31, such as a pipe heater, within a tank or reservoir 9, which is provided for venting and for supplying cooling liquid 100, such as cooling water or oil, and its storage, a temperature sensor 33 which detects the temperature of cooling liquid at the inlet port of the cooling plates 3 of coil 1, and a temperature regulator 32 which receives the output signal of such temperature sensor 33 and controls the ON-OFF state of heater 31 for setting the operating temperature $T_1$ of the coil.

The apparatus thus constitute can be set for the preheating operation from the condition of normal operation where uniform magnetic field 11 is being generated by the following procedures. The cooling device 5, circulation pump 7 and DC power supply 4 are turned of,, the regulation valves 14B are closed and the heater 31 is set ON. Thereby, the cooling liquid 100 driven by the back pressure pump 8 is heated to the operation temperature $T_1$ of coil 1 while it circulates in turn through the heat exchanger 6 which has stopped cooling, the liquid tank 9 having the heater 31, the circulation pump 7 under the stop condition, the regulator valves 13B, the cooling liquid path 13A and the circulation path consisting of the plurality of cooling plates 3. Accordingly, the coil including the cooling plates is kept at the operating temperature $T_1$. In this case, since a thermal resistance between the coil and the cooling liquid can be set easily to a small fraction of the thermal resistance between the coil surface and ambient, the entire coil including the cooling plates can be kept at the operation temperature $T_1$ and the temperature difference in the coil, particularly the thermal deviation in the vertical direction, and the resulting thermal strain of the coil, can be eliminated almost completely. Moreover, changeover to the normal operating condition where the uniform magnetic field 11 is generated from the preheating condition can be realized by the procedures reversed from that described above.

Figure 2:
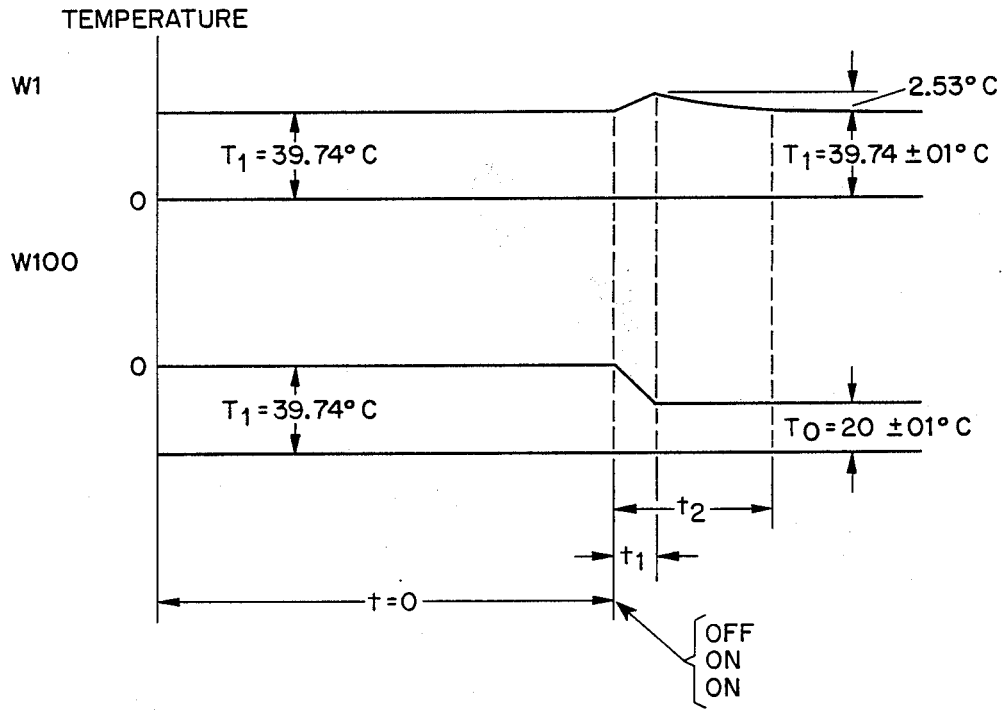
FIG. 2 is a temperature characteristic diagram of this embodiment.

FIG. 2 illustrates the stabilization characteristic diagram of the coil temperature and the cooling liquid temperature of a particular example when the preheating apparatus was changed to that in the embodiment described above. In this example, it is assumed that the coil for NMR-CT is designed for a uniform magnetic field intensity of 0.18T. Uniformity of magnetic field of 100 ppm is to be maintained during change to the normal operation from the preheating operation under the conditions that water is used as the cooling liquid, the operating temperature $T_1$ is 39.74°±0.1° C., and the water temperature at the inlet port of the cooling plates is 20°±0.1° C. In this figure, the characteristic W100 shows a mean temperature of the coil 1 and the characteristic W100 shows the temperature of cooling water 100 at the inlet port of the cooling plates 3. During the preheating operation, the cooling water controlled to be at 39.74° C: flows into the cooling plates and therefore the temperature $T_1$ of uniform magnetic field coil 1 is also kept at 39.74° C. At the time t=0, when operation of heater 31 is stopped, the power supply 4 and the cooling apparatus 10 immediately start the operations. At this time, the cooling water being heated to $T_1 = 39.74°$ C. and the heating apparatus are cooled by the cooling device 5 and the cooling water is lowered and kept at $T_0, = 20°±0.1°$ C. after the water temperature stabilization time $t_1$. Meanwhile, the temperature of coil 1 rises temporarily because the amount of heat generated by the excitation current $I_0$, during the water temperature stabilization time $t_1$ exceeds the amount of heat exhausted by cooling, and after the water temperature stabilization time $t_1$, such temperature rise gradually lowers and the temperature is stabilized at 39.74°±0.1° C. after the coil temperature stabilization time $t_2$. In the case of the apparatus shown in FIG. 1, the water temperature stabilization time $t_1$ was 3 minutes, the overshoot of coil temperature was 2.53° C., and the coil temperature stabilization time $t_2$, was 12 minutes. In particular, the latter is shortened to about ¼ of the coil temperature stabilization time $t_2$ of 45 minutes of the prior art.

The prior art apparatus which uses current heating for the preheating operation as compared to the novel apparatus which uses warmed water for the preheating is more susceptible to thermal deviation because of a non-uniform ambient. In particular, the novel apparatus better simulates the normal operation of the coil during the preheating operation to reduce the influence of the ambient.

Moreover, the novel apparatus described which uses a heater and forced circulation along the circulation path of the cooling apparatus realizes the precooling operation simply and economically, particularly since it permits stoppage of the cooling apparatus during the preheating operation with a consequent saving of power consumption.

Figure 3:
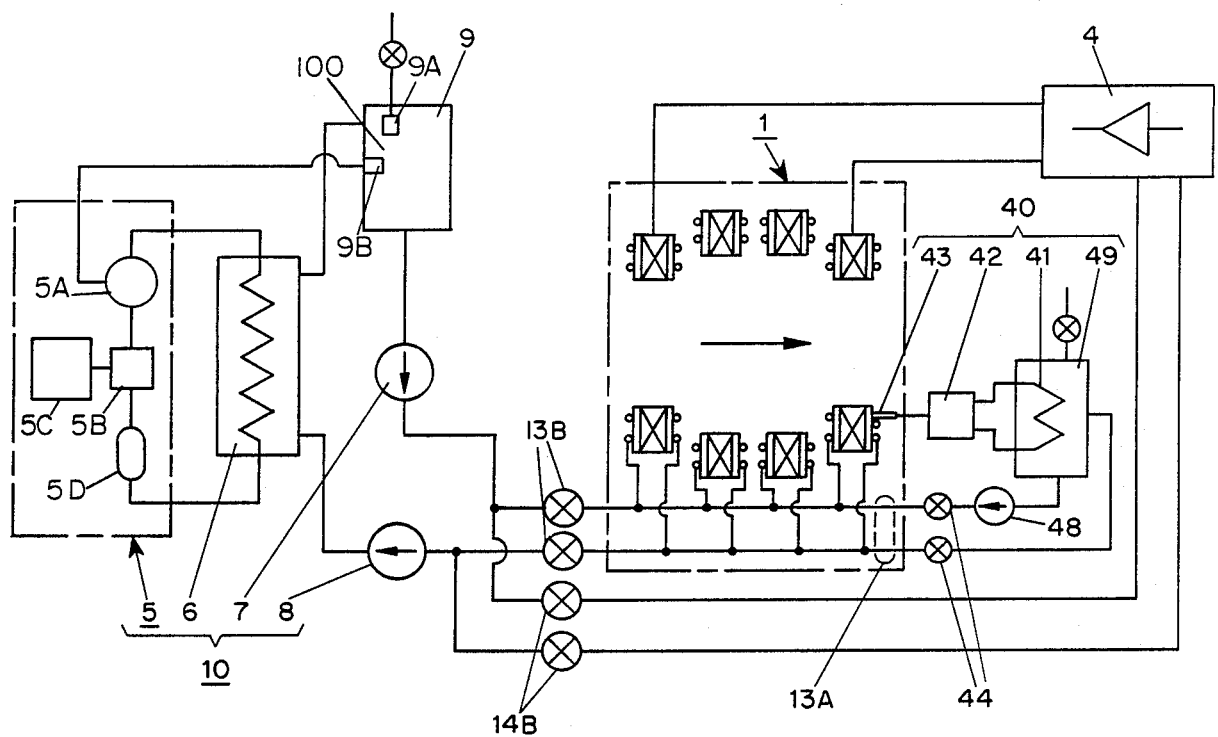
FIG. 3 schematically illustrates another embodiment of the present invention.
Figure 4:
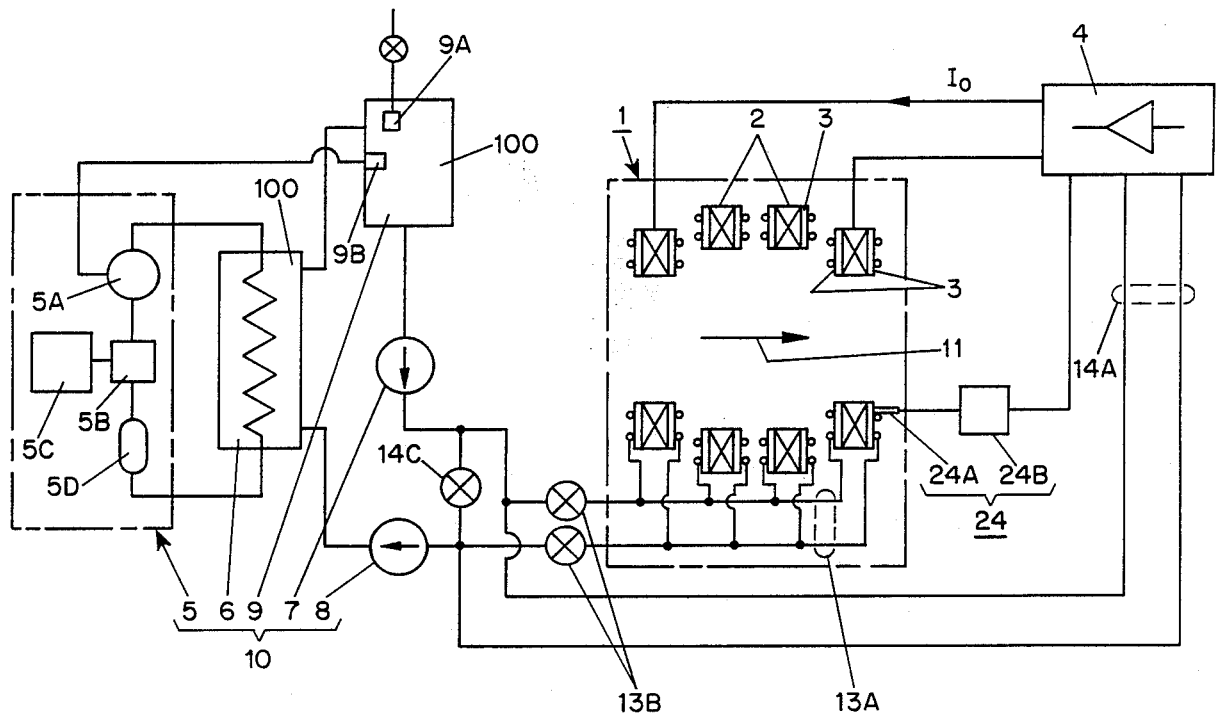
FIG. 4 illustrates a structure of the prior art.

FIG. 3 illustrates another embodiment of the present invention. This embodiment is different from the previous embodiment in that the preheating apparatus 40 comprising the heating tank 49, the heater 41, the temperature regulator 42, the temperature sensor 43 and the circulation pump 48 is provided to the cooling liquid path 13A by way of the valve 44 consisting of a pair of valves that operate in synchrony. The preheating apparatus 40 can be reduced in size by separating the cooling apparatus 10 from the preheating apparatus 40 and therefore the thermal capacity of the preheating apparatus 40 can be reduced. As a result, the water temperature stabilization time $t_1$ can be shortened, overshoot of the coil temperature reduced, and the coil temperature stabilization time $t_2$ further shortened.

Summarizing, the present invention uses a preheating apparatus for the cooling liquid comprising a heater for heating the cooling liquid provided either along the forced circulation path, or in a path communicating thereto, of the cooling apparatus supplying the liquid cooling plates, a temperature sensor which senses the temperature at the inlet port of the cooling liquid used in the cooling plates and controls thereby the ON-OFF state of the heater, and a temperature regulator. This apparatus serves to preheat the coil to a temperature which simulates the normal operating condition prior to the normal operation of the coil. As a result, thermal deviation due to non-uniform distribution of ambient temperature and the resulting thermal stress of the coil, which have been a problem in the prior art, can be eliminated and the coil can be preheated almost uniformly to the temperature simulating the normal operating condition of the coil without the influence of ambient temperature. Therefore, when the preheating operation is changed to the normal operation, the coil temperature stabilization time can be shortened to about ¼ of that of the prior art. As a result, for example, when the coil is used for NMR-CT, the waiting time before use after excitation of the coil can be shortened. This permits the working efficiency of the expensive NMR-CT to be improved. In addition, the preheating apparatus can be included simply by using a forced circulation path. A further advantage of the present invention is that since the cooling apparatus can be turned off and the coil temperature stabilization time can be shortened during the preheating operation, useless power consumption can be lowered.

We claim:

1. In apparatus including a coil for producing a uniform magnetic field, and which is also heated, when supplied with excitation current from a power supply, and a cooling system for maintaining the temperature of said coil within a prescribed operating temperature range while being supplied with excitation current having a cooling liquid circulation path including cooling plates operatively coupled to said coil and through which cooling liquid is circulated, means for cooling said cooling liquid and pump means including a circulation pump and a back pressure pump for circulating said cooling liquid along said circulation path, apparatus for maintaining the temperature of said coil substantially within said prescribed operating temperature range when not being supplied with excitation current, said apparatus comprising heater means disposed in said circulation path for controllably heating the cooling liquid circulated along said circulation path, and means for measuring the temperature of said cooling liquid at a selected point in said circulation path and responsively thereto controlling said heater means to heat the circulating cooling liquid to a temperature which maintains said coil at a temperature within said prescribed range when not supplied with excitation current.

2. Apparatus in accordance with claim 1 in which the cooling liquid circulation path includes a reservoir for the cooling liquid and said heater means is disposed within the reservoir.

3. Apparatus in accordance with claim 1 in which the heating means is located along the circulation path and is separate from said reservoir.

4. Apparatus in accordance with claim 1, wherein said temperature measuring means measures the temperature of said cooling liquid at its entrance into said cooling plates.

5. Apparatus in accordance with claim 1, in which said back pressure pump and said circulation pump are disabled responsively to turning off said power supply and said cooling liquid is circulated by another circulation pump.

* * * * *